United States Patent
Dang et al.

(10) Patent No.: US 8,269,518 B1
(45) Date of Patent: Sep. 18, 2012

(54) METHOD AND APPARATUS FOR PREVENTING PROBE CARD OXIDATION

(75) Inventors: Elvin P. Dang, San Jose, CA (US); Mohsen Mardi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 544 days.

(21) Appl. No.: 12/418,775

(22) Filed: Apr. 6, 2009

(51) Int. Cl.
  *G01R 31/20* (2006.01)
(52) U.S. Cl. ............ 324/758.01; 324/758.04
(58) Field of Classification Search .......... None
  See application file for complete search history.

(56) References Cited

U.S. PATENT DOCUMENTS

| | | | | |
|---|---|---|---|---|
| 4,481,691 A | * | 11/1984 | Le Vantine | 15/306.1 |
| 5,220,279 A | * | 6/1993 | Nagasawa | 324/754.03 |
| 5,778,485 A | * | 7/1998 | Sano et al. | 15/301 |
| 5,968,282 A | * | 10/1999 | Yamasaka | 134/6 |

* cited by examiner

*Primary Examiner* — Vinh Nguyen
(74) *Attorney, Agent, or Firm* — Michael T. Wallace; Gerald Chan

(57) ABSTRACT

A method and apparatus for a pre-biasing storage mechanism to prevent oxidation and other contaminants from forming on the probe tips and probe tails of a probe card. The pre-biasing storage mechanism imposes a positive bias on the probe needles of the probe card so as to create physical contact between the probe tails and the conductive pads of the printed circuit board (PCB) arrangement of the probe card during a disengaged state of the probe card. In addition, the storage mechanism imposes a positive bias on the probe needles of the probe card, so as to create physical contact between the probe tips and a probe tip cleaning pad, or other protective surface, during a disengaged state of the probe card.

20 Claims, 6 Drawing Sheets

METHOD AND APPARATUS FOR PREVENTING PROBE CARD OXIDATION

FIELD OF THE INVENTION

The present invention generally relates to the testing of integrated circuits, and more particularly to the prevention of oxidation within the probe card used to test the integrated circuits.

BACKGROUND OF THE INVENTION

The advent of the integrated circuit has spawned the necessity for automated testing to achieve rapid, accurate, and high volume results. Accordingly, automated test equipment (ATE) has been developed to maximize integrated circuit test efficiency, while minimizing the amount of human intervention that is required to complete a particular set of test scenarios.

A typical ATE includes a wafer probe station that secures a single integrated circuit, or a wafer containing multiple integrated circuits, into position to allow a device tester to exercise one of the integrated circuits using automated test sequences. More advanced ATEs provide the ability to implement test scenarios in parallel, whereby multiple integrated circuits may be exercised simultaneously. The integrated circuit, or wafer containing multiple integrated circuits, is often referred to as the device under test (DUT).

The DUT may exhibit a multitude of input/output (I/O) pad configurations, whereby any number of pads may be distributed in any number of configurations in accordance with the requirements of the particular DUT. The I/O pad configurations then allow the injection of test signals and the reception of the responses to those test signals from/to the ATE. Developers of ATE equipment, therefore, are challenged with the daunting task of designing ATEs that are compatible with as many I/O pad configurations as possible.

To improve compatibility, the corresponding wafer probe stations of the ATEs employ a probe card that acts as an interface between the ATE and the DUT. The probe card includes a probe head that is designed to be compatible with the I/O pads of the DUT while at the same time providing compatibility to the ATE. As such, the probe head includes a first set of test probes that are used to inject stimuli into the one or more input pads of the DUT. The probe head also includes a second set of test probes that are used to receive each DUT's response to the test stimuli injected by the first set of test probes.

The probe head, among other features, facilitates a mechanical translation between the fixed pin-out capabilities of the ATE, such as hard-wired input/output channels, into a flexible arrangement of probe pins that are compatible with the I/O pads of the DUT. In order to facilitate the mechanical translation, the probe head may be arranged as a vertical probe card such as a Cobra® probe card.

A Cobra® probe card implements a vertical probe design, whereby probe pins float in a substantially vertical direction 124 within probe head 114 as exemplified in FIG. 1. Vertical probe card 100 is exemplified as a vertical probe card that is comprised of printed circuit board (PCB) arrangement 126 and probe head arrangement 128. Vertical probe card 100 is illustrated in a disengaged state, such that probe needles 130 are separated from pads 104 of PCB arrangement 126 by separation distance 132.

Guide plates 110 and 116 are utilized within vertical probe card 100 to align probe needles 130 to their respective I/O pad connections. Probe tails 108 of probe needles 130, for example, are guided by top guide plate 110 through channels 112 so that proper engagement of probe tails 108 with pads 104 of PCB arrangement 126 is facilitated. In particular, movement of probe needles 130 in a substantially vertical direction 124 is facilitated by top guide plate 110 via channels 112 so that gap 132 is eventually closed to allow probe tails 108 to physically engage pads 104 during execution of a test scenario by the ATE.

Similarly, probe tips 120 of probe needles 130 are guided by bottom guide plate 116 so that proper engagement of probe tips 120 with pads (not shown) of DUT 134 is facilitated. In particular, movement of probe needles 130 in a substantially vertical direction 124 is facilitated by bottom guide plate 116 so that gap 136 is eventually closed to allow probe tips 120 to properly engage the DUT's I/O pads (not shown) during a test scenario.

It is noted that probe head 114 provides channels 122 to relieve a portion of the stress imposed upon probe needles 130 while probe needles are physically engaged with DUT 134 and PCB arrangement 126 during execution of the test scenario. In particular, channels 122 facilitate flexing of probe needles 130 upon engagement of probe tails 108 with pads 104 and upon engagement of probe tips 120 with DUT 134. Further, channels 122 facilitate proper engagement of probe tips 120 with DUT 134 even when the I/O pads of DUT 134 do not exhibit a uniform height in direction 124. Such may be the case, for example, when probe tips 120 are required to engage DUT pads implemented as, e.g., micro-bump configurations, that are utilized in conjunction with flip-chip bonding to subsequently bond the DUT's semiconductor substrate and the DUT's corresponding semiconductor package after successful testing of the integrated circuit is complete.

As discussed above, vertical probe card 100 is illustrated to be in a disengaged state, such that gap 132 exists between probe tails 108 and pads 104. Over an extended amount of time, a sufficient amount of oxidation, as well as other non-conductive contaminants, may collect on probe tails 108 during the disengaged state, such that even when probe tails 108 are engaged with pads 104, a sufficient amount of resistance exists between probe tails 108 and pads 104 to cause an open-circuit condition to be registered by the ATE during the test sequence. As such, a false indication is registered as a result of the open-circuit condition and the test scenario incorrectly fails due to the open-circuit condition.

SUMMARY OF THE INVENTION

To overcome limitations in the prior art, and to overcome other limitations that will become apparent upon reading and understanding the present specification, various embodiments of the present invention disclose a method and apparatus for a probe card that is not conducive to oxidation. As such, the probe tips and probe tails of the probe card remain conductive throughout the probe card's disengaged state to yield accurate results during execution of a test scenario by automated test equipment (ATE) during the probe card's engaged state.

In accordance with one embodiment of the invention, a method of utilizing a pre-biasing storage mechanism within a probe card to prevent oxidation of probe needles within a probe head of the probe card comprises establishing physical contact between the pre-biasing storage mechanism and the probe head. In response to the physical contact, pre-biasing probe tails of the probe head to physically engage a printed circuit board arrangement of the probe card. In further response to the physical contact, pre-biasing probe tips of the probe head to physically engage the pre-biasing storage mechanism of the probe card.

In accordance with another embodiment of the invention, a probe card comprises a printed circuit board arrangement that includes a plurality of conductive pads displaced on a first surface of the printed circuit board arrangement. The probe card further comprises a probe head arrangement that includes a probe head having probe needles displaced within channels of the probe head, the probe needles exhibiting a freedom of movement within the channels of the probe head. The probe card further comprises a pre-biasing storage mechanism that is coupled to the printed circuit board arrangement. Probe tails of the probe needles are maintained in physical contact with the plurality of conductive pads of the printed circuit board arrangement in response to the coupling of the pre-biasing storage mechanism to the printed circuit board arrangement.

In accordance with another embodiment of the invention, an automated test equipment system comprises a probe station that is adapted to characterize electrical characteristics of a device under test during a first mode of operation. The probe station includes a probe card that is pre-biased to a storage state that substantially prohibits the formation of non-conductive contaminants on probe needles of the probe card during a second mode of operation. The probe card includes a printed circuit board arrangement including a plurality of conductive pads displaced on a first surface of the printed circuit board arrangement. The probe card further includes a probe head arrangement including a probe head, where the probe needles are displaced within channels of the probe head and where the probe needles exhibit a freedom of movement within the channels of the probe head. The probe card further includes a pre-biasing storage mechanism that is coupled to the printed circuit board arrangement. Probe tails of the probe needles are maintained in physical contact with the plurality of conductive pads of the printed circuit board arrangement in response to the coupling of the pre-biasing storage mechanism to the printed circuit board arrangement.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which programmable logic devices (PLDs) are a subset. In particular, a method and apparatus is provided to facilitate testing of ICs using a probe card that is to be utilized in conjunction with an automated test equipment (ATE) system, which includes a wafer prober and a disposition handler. The probe card utilized by the wafer prober facilitates the use of a pre-biasing storage mechanism, whereby oxidation and other contaminants are substantially prevented from forming on the probe tips and the probe tails of the probe card.

It is noted here that the terms "bias" and "biasing" are used throughout this document in their mechanical sense as opposed to an electrical or electronic sense. "Biasing, as it is used herein, implies a physical, mechanical, positioning or the imparting of a tendency to seek a physical position. While the electrical sense is not denied nor avoided in this usage, embodiments of the present invention will more often be explained by reference to the mechanical and positional sense of the terms.

In accordance with one embodiment of the present invention, the storage mechanism imposes a positive bias on the probe needles of the probe card so as to create physical contact between the probe tails and the conductive pads of the printed circuit board (PCB) arrangement of the probe card during a disengaged state of the probe card. In addition, the storage mechanism imposes a positive bias on the probe needles, such that the probe tips also remain in contact with a probe tip cleaning pad, or other protective surface, during a disengaged state of the probe card.

Figure 1:
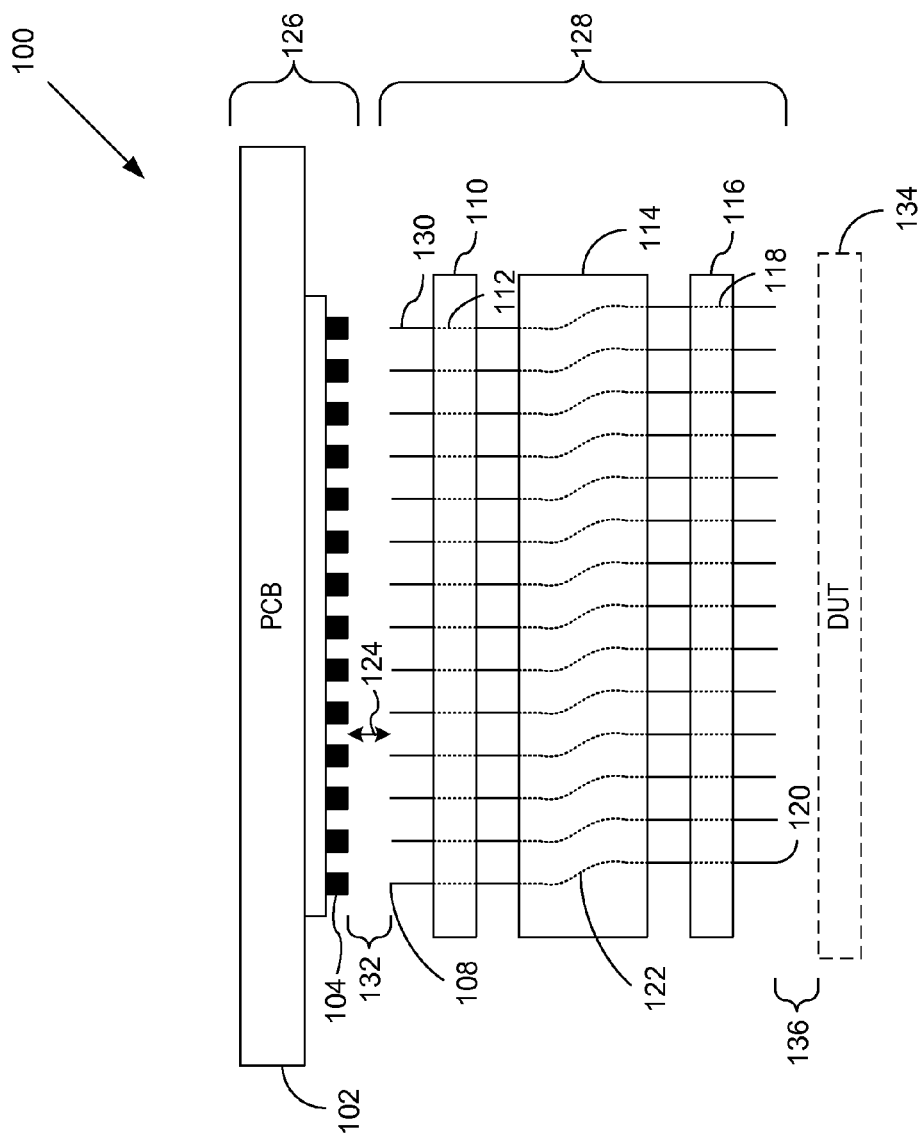
FIG. 1 illustrates an exemplary vertical probe card for use during testing of a device under test.
Figure 2:
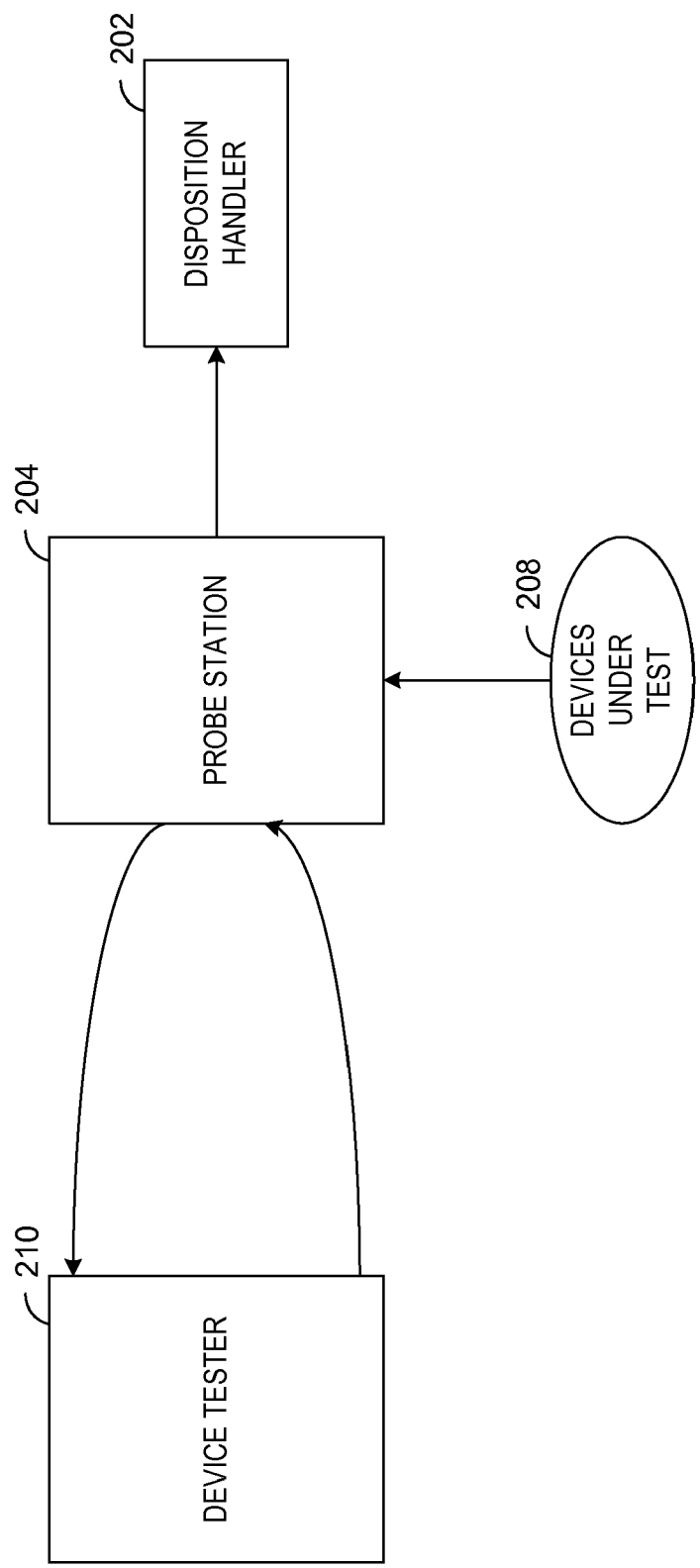
FIG. 2 illustrates a block diagram of an automated test equipment (ATE) system that may utilize the vertical probe card of FIG. 1 during execution of a test scenario.

Turning to FIG. 2, a block diagram of an ATE system in accordance with one embodiment of the present invention is illustrated, whereby mass production electrical testing of integrated circuits (ICs) at wafer sort, or final die test, may be executed. Probe station 204 represents an electro-mechanical device that probes input/output (I/O) pads of devices under test (DUTs) 208 so as to complete electrical conductivity between the I/O pads of DUT 208 and device tester 210. Once the various I/O pads of DUT 208 are placed into electrical communication with device tester 210 by probe station 204, device tester 210 automatically characterizes the electrical characteristics and performance of devices under test 208 in accordance with one or more automated test scenarios.

In general, the ATE system of FIG. 2 is a microprocessor-based system that controls wafers, or singulated integrated circuit die, within probe station 204 so that electrical excitations may be supplied to DUTs 208 by device tester 210. Probe station 204 is also configured to receive the responses received from DUTs 208 when DUTs 208 are stimulated by device tester 210. Device tester 210 contains boards/modules that measure the electrical characteristics of devices under test 208 in response to the electrical excitations and electrical excitation responses that are facilitated through probe station 204.

The characterization process implemented by device tester 210 is controlled by a microprocessor-based system that executes test sequences defined by a high-level programming language, such as C and/or C++. Each test sequence characterizes DUTs 208 by instructing a first set of test probes (not shown) within probe station 204 to apply electrical stimuli to DUTs 208 and then instructing a second set of test probes (not shown) within probe station 204 to characterize the DUT's responses to the electrical stimuli.

The DUTs 208 are then returned to disposition handler 202 (or equivalent), where DUTs 208 are categorized as pass/fail devices in response to DUTs' 208 characterization results. If DUTs 208 are singulated die, disposition handler 202 may then parse each DUT 208 into pass/fail bins (not shown) for disposition of DUTs 208 in response to the characterization results.

When probe station 204 is in storage, i.e., when probe station 204 is not physically engaging probe needles to the various I/O pads of DUTs 208 during a test scenario, then the probe card (not shown) within probe station 204 is pre-biased to a storage state that substantially prohibits oxidation and other non-conductive contaminants from forming on the probe tips and probe tails of the probe needles of the probe card. That is to say, in other words, that in accordance with one embodiment of the present invention, the pre-bias that is applied to the probe card substantially prevents oxidation and other non-conductive contaminants from forming on the probe tips and probe tails of the probe needles of the probe card.

Figure 3:
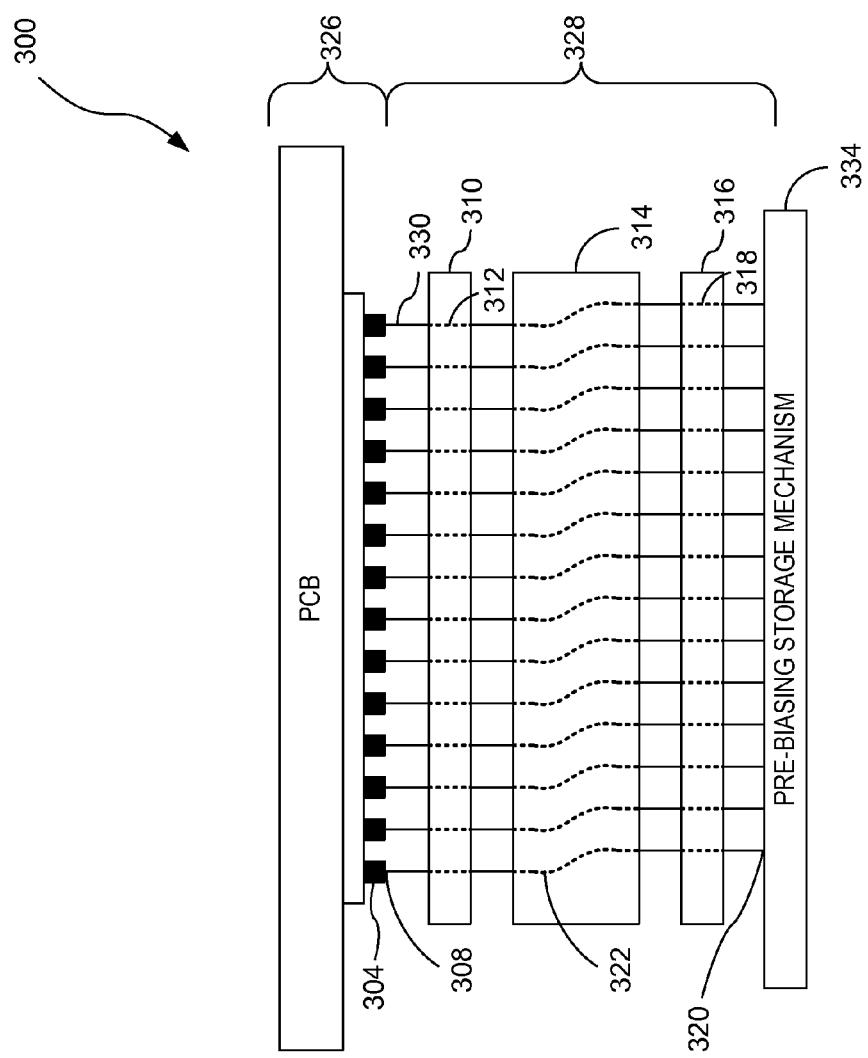
FIG. 3 illustrates a block diagram of a vertical probe card that utilizes a pre-biasing storage mechanism to substantially prevent oxidation of the probe tips and probe tails of the vertical probe card in accordance with an embodiment of the present invention.

Turning to FIG. 3, pre-biasing storage mechanism 334 of probe card 300 is illustrated in accordance with one embodiment of the present invention to implement the pre-bias of probe card 300. Probe card 300 is exemplified as a vertical probe card that is comprised of printed circuit board (PCB) arrangement 326 and probe head arrangement 328. As illustrated, vertical probe card 300 is exemplified in a disengaged state, i.e., probe head 314 is not physically engaging probe needles to the various I/O pads of a DUT during a test scenario. Probe needles 330 are, nevertheless, in physical contact with pads 304 of PCB arrangement 326 by operation of pre-biasing storage mechanism 334.

Guide plates 310 and 316 are utilized within vertical probe card 300 to align probe needles 330 to their respective pad connections. Probe tails 308 of probe needles 330, for example, are guided by top guide plate 310 through channels 312 so that proper engagement of probe tails 308 with pads 304 of PCB arrangement 326 is facilitated. In particular, movement of probe needles 330 in a substantially vertical direction is facilitated by the placement of pre-biasing storage mechanism 334, whereby top guide plate 310 guides probe needles 330 via channels 312 so that no gap exists between probe tails 308 and pads 304 during the disengaged state of probe head 314.

Similarly, probe tips 320 of probe needles 330 are guided by bottom guide plate 316 so that proper engagement of probe tips 320 with pre-biasing storage mechanism 334 is facilitated. In particular, movement of probe needles 330 in a substantially vertical direction is facilitated by bottom guide plate 316 so that no gap exists between probe tips 320 and pre-biasing storage mechanism 334 during the disengaged state of probe head 314.

It is noted that probe head 314 provides channels 322 to relieve a portion of the stress imposed upon probe needles 330 during the disengaged state of probe head 314. In particular, channels 322 facilitate flexing of probe needles 330 upon physical engagement of probe tails 308 with pads 304 and upon physical engagement of probe tips 320 with pre-biasing storage mechanism 334. Further, channels 322 facilitate proper engagement of probe tips 320 with pre-biasing storage mechanism 334 even if pre-biasing storage mechanism 334 does not exhibit a uniform height. Such may be the case, for example, when pre-biasing storage mechanism 334 does not exhibit a completely flat surface with reference to the orientation of probe tips 320.

As discussed above, vertical probe card 300 is illustrated in a disengaged state, but through application of pre-biasing storage mechanism 334, probe tails 308 are maintained in physical contact with pads 304 of PCB arrangement 326. As such, oxidation, as well as other non-conductive contaminants, is substantially prevented from forming on probe tails 308 while probe head 314 is in a disengaged state. Furthermore, application of pre-biasing storage mechanism 334 allows probe tips 320 to be maintained in physical contact with pre-biasing storage mechanism 334. As such, oxidation, as well as other non-conductive contaminants, is also substantially prevented from forming on probe tips 320 while probe head 314 is in a disengaged state.

Figure 4:
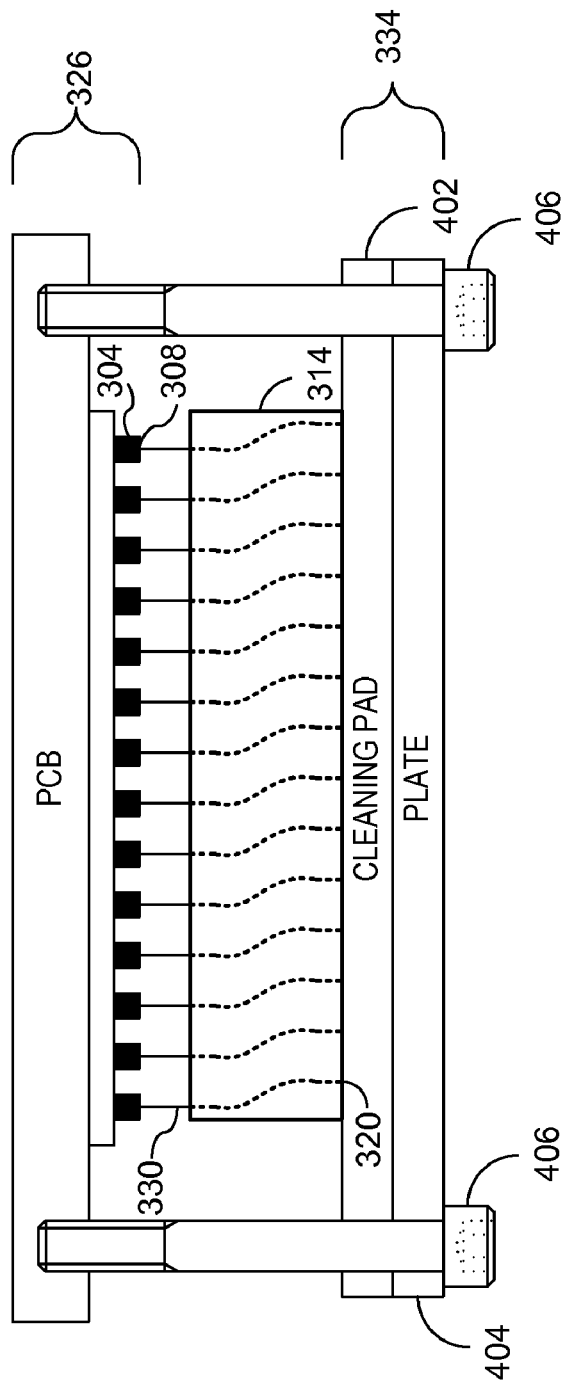
FIG. 4 illustrates a block diagram of exemplary aspects of the pre-biasing storage mechanism of FIG. 3 in accordance with an embodiment of the present invention.

Turning to FIG. 4, a more detailed view of pre-biasing storage mechanism 334 is illustrated in accordance with one embodiment of the present invention, where top and bottom guide plates of the probe card have been omitted for clarity. A resilient cleaning pad 402 may be used to clean probe tips 320 of probe needles 330 while pre-biasing storage mechanism 334 is brought into physical contact with probe head 314. As illustrated in FIG. 4, the combination of cleaning pad 402 and plate 404 are brought into physical contact with probe tips 320 when attachment mechanisms 406 are engaged with PCB arrangement 326. Additionally, probe tails 308 of probe needles 330 are pre-biased onto pads 304 of PCB arrangement 326 so that probe tails 308 remain in physical contact with pads 304 while probe head 314 is in a disengaged state.

Since probe tails 308 are in physical contact with pads 304, no opportunity is provided for oxidation, or other non-conductive contaminants, to form on probe tails 308. Additionally, since probe tips 320 of probe needles 330 are in physical contact with cleaning pad 402, no opportunity is provided for oxidation, or other non-conductive contaminants, to form on probe tips 320 either. Furthermore, since cleaning pad 402 is designed as a cleaning surface, such as through the use of ceramic or a chromium oxide abrasive film, any contamination of probe tips 320 may be removed by cleaning pad 402 by the physical engagement of cleaning pad 402 with probe tips 320.

Figure 5:
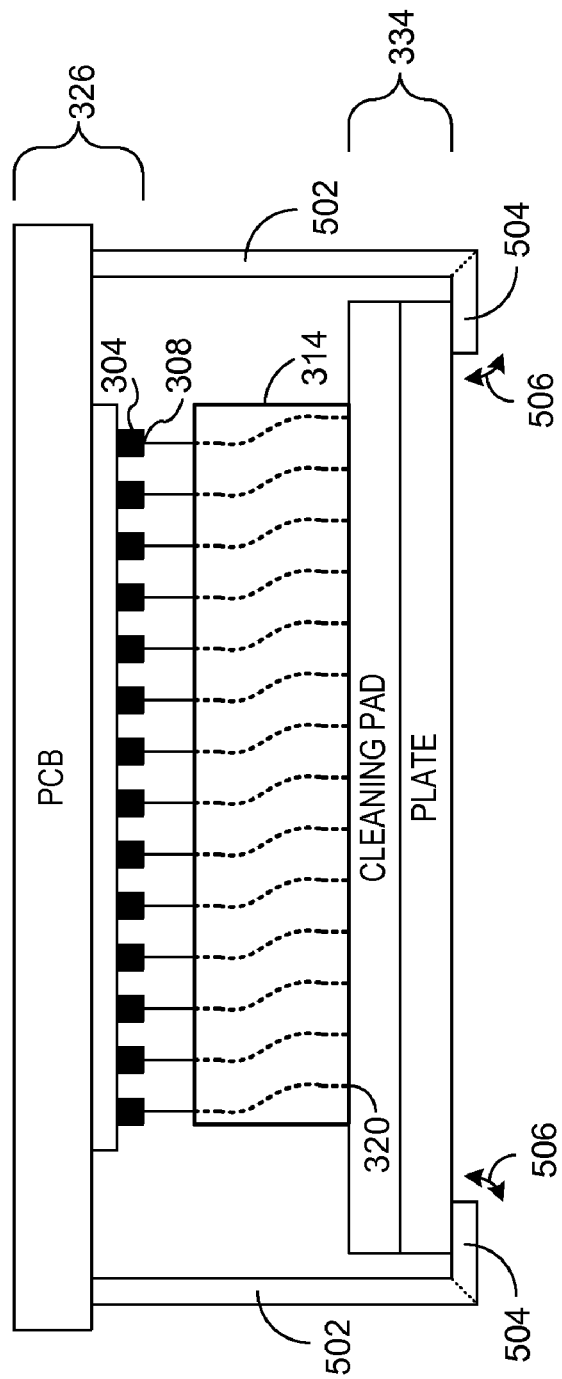
FIG. 5 illustrates a latching mechanism of the pre-biasing storage mechanism of FIG. 4 in accordance with an alternate embodiment of the present invention.

It should be noted that attachment means, other than attachment mechanisms 406 of FIG. 4, may be used to similarly pre-bias probe needles 330 as exemplified in FIG. 5. For example, attachment posts 502 may be utilized in conjunction with latch mechanisms 504 as illustrated. Latch mechanisms 504 may swivel in directions 506, thus allowing pre-biasing storage mechanism 334 to be locked into place so as to pre-bias probe tails 308 onto pads 304 by physical engagement of probe tails 308 with pads 304 and to pre-bias probe tips 320 onto pre-biasing storage mechanism 334 by physical engagement of probe tips 320 onto pre-biasing storage mechanism 334.

Attachment posts 502 may, therefore, be permanently attached to PCB arrangement 326, where latch mechanisms 504 are placed into the illustrated position while probe head 314 is in a disengaged state. Latch mechanisms 504 may then be rotated in direction 506 to allow removal of pre-biasing storage mechanism 334 in preparation for the engagement of the probe card with a DUT (not shown). That is to say, in other words, that attachment posts 502 and latch mechanisms 504 may remain connected to PCB arrangement 326 even during execution of a test scenario. Once the test scenario terminates and the probe card is ready for storage, then pre-biasing storage mechanism 334 may be attached to probe head 314, via attachment posts 502 and latch mechanisms 504, to protect probe tails 308 and probe tips 320 from contamination from oxides or other contaminants as discussed above.

Figure 6:
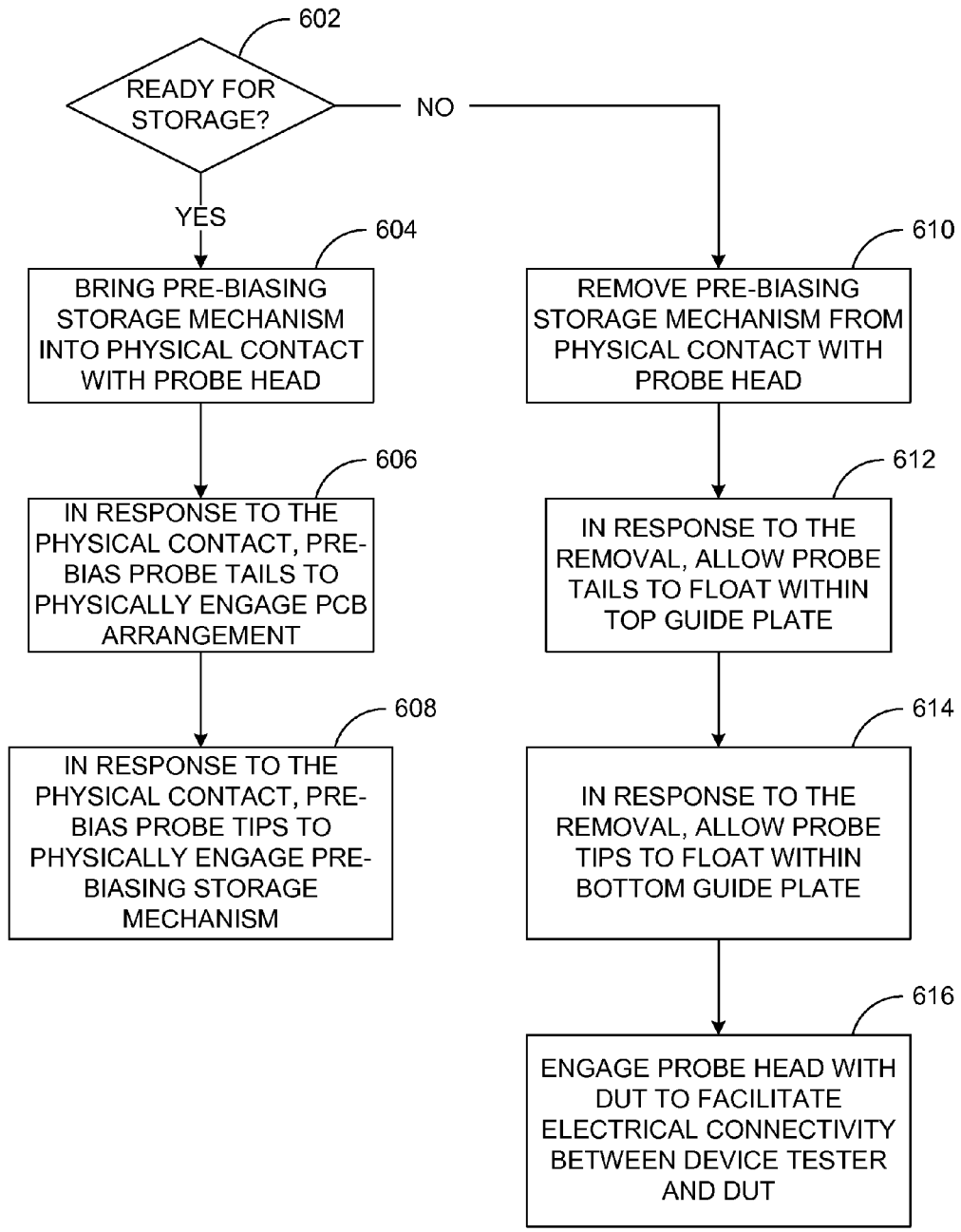
FIG. 6 illustrates a flow diagram of a method of utilizing the pre-biasing storage mechanism of FIGS. 3, 4, and 5 in accordance with various embodiments of the present invention.

Turning to FIG. 6, a flow diagram of a method of utilizing a pre-biasing storage mechanism in accordance with the various embodiments of the present invention is illustrated. In step 602, a determination is made as to whether probe head 314 is to be prepared for storage. If no further testing is required, then probe head storage is required and probe head 314 is prepared for storage as in steps 604-608.

In step 604, a pre-biasing storage mechanism 334 is brought into physical contact with probe head 314. In a first embodiment, probe head 314 may be brought into physical contact with pre-biasing storage mechanism 334 through the use of attachment mechanisms 406 and their engagement with PCB arrangement 326 as discussed above in relation to FIG. 4. In alternate embodiments, attachment posts 502 may be utilized in conjunction with latch mechanisms 504 as discussed above in relation to FIG. 5. Latch mechanisms 504 may swivel in directions 506, thus allowing pre-biasing storage mechanism 334 to be locked into place so as to pre-bias probe tails 308 onto pads 304 by physical engagement of probe tails 308 with pads 304 as in step 606 and to pre-bias probe tips 320 onto pre-biasing storage mechanism 334 by physical engagement of probe tips 320 onto pre-biasing storage mechanism 334 as in step 608.

In response to the physical contact of pre-biasing storage mechanism 334 with probe head 314, probe tails 308 are pre-biased onto pads 304 so as to cause physical engagement of probe tails 308 onto pads 304 as in step 606. In particular, probe tails 308 of probe needles 330 are guided by top guide plate 310 through channels 312 so that proper engagement of probe tails 308 with pads 304 of PCB arrangement 326 is facilitated. Movement of probe needles 330 in a substantially vertical direction is facilitated by the placement of pre-biasing storage mechanism 334, whereby top guide plate 310 guides probe needles 330 via channels 312 so that no gap exists between probe tails 308 and pads 304 during the disengaged state of probe head 314. In addition, a pre-determined amount of compression force may be imposed upon probe needles 304 as to provide sufficient physical engagement between probe tails 308 and pads 304.

In response to the physical contact of pre-biasing storage mechanism 334 with probe head 314, probe tips 320 are also pre-biased onto pre-biasing storage mechanism 334 so as to cause physical engagement of probe tips 320 onto pre-biasing storage mechanism 334 as in step 608. In particular, probe tips 320 of probe needles 330 are guided by bottom guide plate 316 so that proper engagement of probe tips 320 with pre-biasing storage mechanism 334 is facilitated. Movement of probe needles 330 in a substantially vertical direction is facilitated by bottom guide plate 316 so that no gap exists between probe tips 320 and pre-biasing storage mechanism 334 during the disengaged state of probe head 314. In addition, a pre-determined amount of compression force may be imposed upon probe needles 330 as to provide sufficient physical engagement between probe tips 320 and pre-biasing storage mechanism 334.

If, on the other hand, test scenarios are to be executed, then probe head storage is not required and probe head 314 is instead prepared to facilitate test scenarios within probe station 204 as in steps 610-616. In step 610, pre-biasing storage mechanism 334 is removed from physical contact with probe head 314. In a first embodiment, probe head 314 may be removed from physical contact with pre-biasing storage mechanism 334 by detaching attachment mechanisms 406 from their engagement with PCB arrangement 326 as discussed above in relation to FIG. 4. In alternate embodiments, attachment posts 502 may instead be utilized in conjunction with latch mechanisms 504 as discussed above in relation to FIG. 5 to facilitate quick removal. Latch mechanisms 504 may swivel in directions 506, for example, thus allowing pre-biasing storage mechanism 334 to be removed so as allow probe tails 308 to float within top guide plate 310 as in step 612 and to allow probe tips 320 to float within bottom guide plate 316 as in step 614.

Next, probe head 616 is brought into physical communication with DUT 208 as in step 616, so as to facilitate electrical connectivity between device tester 210 and DUT 208 during execution of the test scenario. Once testing is complete, the probe card may then undergo storage steps 602-608 to substantially prevent oxidation, or other non-conductive contaminants, from forming on probe tips 320 or probe tails 308.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of utilizing a pre-biasing storage mechanism within a probe card to prevent oxidation of probe needles within a probe head of the probe card, the method comprising:
   establishing physical contact between the pre-biasing storage mechanism and the probe head;
   in response to the physical contact, pre-biasing probe tails of the probe head to physically engage a printed circuit board arrangement of the probe card; and
   in further response to the physical contact, pre-biasing probe tips of the probe head to physically engage the pre-biasing storage mechanism of the probe card.

2. The method of claim 1, wherein establishing physical contact between the pre-biasing storage mechanism and the probe head comprises engaging attachment mechanisms with the printed circuit board arrangement and the pre-biasing storage mechanism to maintain physical contact between the pre-biasing storage mechanism and the probe head.

3. The method of claim 2, wherein establishing physical contact between the pre-biasing storage mechanism and the probe head further comprises engaging the attachment mechanisms to the pre-biasing storage mechanism using swivel mechanisms.

4. The method of claim 3, further comprising disengaging the pre-biasing storage mechanism from the probe head using the swivel mechanisms.

5. The method of claim 1, wherein pre-biasing probe tails of the probe head to physically engage a printed circuit board arrangement of the probe card comprises guiding the probe tails to the printed circuit board arrangement using a top guide plate.

6. The method of claim 5, wherein pre-biasing probe tips of the probe head to physically engage the pre-biasing storage mechanism of the probe card comprises guiding the probe tips to the pre-biasing storage mechanism using a bottom guide plate.

7. The method of claim 6, further comprising relieving a portion of stress imposed upon the probe tails by allowing flexing of the probe needles within channels of the probe head.

8. The method of claim 7, further comprising relieving a portion of stress imposed upon the probe tips by allowing flexing of the probe needles within channels of the probe head.

9. The method of claim 8, further comprising flexing the probe needles to facilitate engagement of the probe tips to a non-uniform height of the pre-biasing storage mechanism.

10. The method of claim 1, wherein pre-biasing probe tails of the probe head to physically engage the printed circuit board arrangement of the probe card substantially prevents non-conductive contaminants from forming on the probe tails.

11. The method of claim 1, wherein pre-biasing probe tips of the probe head to physically engage the pre-biasing storage mechanism of the probe card substantially prevents non-conductive contaminants from forming on the probe tips.

12. The method of claim 11, further comprising cleaning the probe tips using a cleaning pad of the pre-biasing storage mechanism in response to the physical contact between the pre-biasing storage mechanism and the probe head.

13. A probe card, comprising:
a printed circuit board arrangement including a plurality of conductive pads displaced on a first surface of the printed circuit board arrangement;
a probe head arrangement including a probe head having probe needles displaced within channels of the probe head, the probe needles exhibiting a freedom of movement within the channels of the probe head; and
a pre-biasing storage mechanism coupled to the printed circuit board arrangement, wherein probe tails of the probe needles are maintained in physical contact with the plurality of conductive pads of the printed circuit board arrangement in response to the coupling of the pre-biasing storage mechanism to the printed circuit board arrangement;
wherein the probe card is a part of an automated test equipment that is adapted to characterize electrical characteristics of a device under test during a first mode of operation, and wherein the probe card is pre-biased to a storage state that substantially prohibits formation of non-conductive contaminants on the probe needles of the probe card during a second mode of operation.

14. The probe card of claim 13, wherein the probe head arrangement further includes a top guide plate adapted to align the probe tails with the plurality of conductive pads of the printed circuit board arrangement.

15. The probe card of claim 14, wherein the probe head arrangement further includes a bottom guide plate adapted to align probe tips of the probe needles with the pre-biasing storage mechanism.

16. The probe card of claim 15, wherein the channels of the probe head facilitate flexing of the probe needles to relieve a portion of stress imposed upon the probe needles in response to the coupling of the pre-biasing storage mechanism to the printed circuit board arrangement.

17. An automated test equipment system, comprising:
a probe station adapted to characterize electrical characteristics of a device under test during a first mode of operation, the probe station including a probe card that is pre-biased to a storage state that substantially prohibits the formation of non-conductive contaminants on probe needles of the probe card during a second mode of operation, the probe card including,
a printed circuit board arrangement including a plurality of conductive pads displaced on a first surface of the printed circuit board arrangement;
a probe head arrangement including a probe head, wherein the probe needles are displaced within channels of the probe head, the probe needles exhibiting a freedom of movement within the channels of the probe head; and
a pre-biasing storage mechanism coupled to the printed circuit board arrangement, wherein probe tails of the probe needles are maintained in physical contact with the plurality of conductive pads of the printed circuit board arrangement in response to the coupling of the pre-biasing storage mechanism to the printed circuit board arrangement.

18. The automated test equipment system of claim 17, wherein the probe head arrangement further includes a top guide plate adapted to align the probe tails with the plurality of conductive pads of the printed circuit board arrangement.

19. The automated test equipment system of claim 18, wherein the probe head arrangement further includes a bottom guide plate adapted to align probe tips of the probe needles with the pre-biasing storage mechanism.

20. The automated test equipment system of claim 19, wherein the channels of the probe head facilitate flexing of the probe needles to relieve a portion of stress imposed upon the probe needles in response to the coupling of the pre-biasing storage mechanism to the printed circuit board arrangement.

* * * * *